United States Patent
Lai

[19]

[11] Patent Number: 6,133,131
[45] Date of Patent: Oct. 17, 2000

[54] METHOD OF FORMING A GATE SPACER ON A SEMICONDUCTOR WAFER

[75] Inventor: Yeong-Chih Lai, Nan-Tou, Taiwan

[73] Assignee: United Microelectronics Corp., Hsin-Chu, Taiwan

[21] Appl. No.: 09/293,964

[22] Filed: Apr. 19, 1999

[51] Int. Cl.[7] .................. H01L 21/3205; H01L 21/4763
[52] U.S. Cl. .................... 438/595; 438/439; 438/366; 438/303; 438/230; 438/184
[58] Field of Search ..................... 438/596, 595, 438/439, 445–446, 366–367, 303–304, 230–231, 242, 184–185

[56] References Cited

U.S. PATENT DOCUMENTS

| | | | |
|---|---|---|---|
| 4,764,482 | 8/1988 | Hsu | 438/203 |
| 4,986,878 | 1/1991 | Malazgirt . | |
| 5,045,486 | 9/1991 | Chittipeddi et al. | 438/231 |
| 5,702,568 | 12/1997 | Shin et al. | 438/632 |
| 5,716,882 | 2/1998 | Tseng | 438/253 |
| 5,747,381 | 5/1998 | Wu . | |
| 5,914,498 | 6/1999 | Suzawa et al. | 257/66 |
| 5,976,939 | 11/1999 | Thompson et al. | 438/305 |

*Primary Examiner*—Charles Bowers
*Assistant Examiner*—Thanh Nguyen
*Attorney, Agent, or Firm*—Winston Hsu

[57] ABSTRACT

The present invention relates to a method of forming a gate spacer on the semiconductor wafer. Two dielectric layers are first formed on the surface of the semiconductor wafer, the first dielectric layer is an USG dielectric layer and the second dielectric layer is a SOG dielectric layer. The SOG dielectric layer is formed by a spincoating process to create a flat surface on the semiconductor wafer. Afterward, the plasma etching, wet etching and dry etching processes are sequentially performed to remove the SOG dielectric layer and USG dielectric layer. Finally, the spacer is formed on the side-wall of the gate.

10 Claims, 6 Drawing Sheets

METHOD OF FORMING A GATE SPACER ON A SEMICONDUCTOR WAFER

BACKGROUND OF THE INVENTION

1. Field of the Invention

The present invention relates to a method of forming a gate spacer on a semiconductor wafer.

2. Description of the Prior Art

During a semiconductor process, the gate spacer isolates the gate, drain and source electrically. The spacer and gate can together be used as a mask during the heavy doping process of the drain and source. In general, formation of the spacer is accomplished by first depositing an undoped silicate glass (USG) dielectric layer then removing part of the USG dielectric layer by an etching process. The remaining USG dielectric layer on the side-wall of the gate is the spacer.

Please refer to FIG. 1 to FIG. 3. FIGS. 1 to 3 are schematic diagrams of a method of forming a spacer 12 of a gate 18 on a semiconductor wafer 10 according to the prior art. As shown in FIG. 1, a semiconductor wafer 10 comprises a Si substrate 14, two field oxide regions 16,17 formed on the Si substrate 14 for electrical isolation, and a gate 18 formed on the field oxide region 17. The gate 18 protrudes from the surface of the semiconductor wafer 10 such that the top end of the gate 18 is higher than the top end of the field oxide region 16. Please refer to FIG. 2. To form the spacer 12, a USG dielectric layer 20 is first formed on the semiconductor wafer 10 by atmospheric pressure chemical vapor deposition (APCVD). The resultant USG dielectric layer 20 covers both the gate 18 and field oxide region 16. However, the top end of the gate 18 is higher than the top end of the field oxide region 16, it causes a problem with step coverage during the APCVD process. Finally, the thickness (a) of the USG dielectric layer 20 above the gate 18 is larger than the thickness (b) of the USG dielectric layer 20 above the field oxide region 16.

Please refer to FIG. 3. An anisotropic etching process is performed on the semiconductor wafer. The USG dielectric layer 20 is partially removed. The remaining parts of the USG dielectric layer 20 on the side-wall of the gate 18 form the two spacers 12 of the gate 18. However, if the USG dielectric layer 20 above the gate 18 is to be removed completely, over-etching will occur on the USG dielectric layer 20 above the field oxide region 16. This may reduce the thickness of the field oxide region 16 and degrade electrical isolation efficiency. In FIG. 3, the dashed line indicates the top end of non-over-etched field oxide region 16 and the solid line indicates the top end of the over-etched field oxide region 16. The thickness difference between the non-over-etched field oxide region 16 and the over-etched field oxide region 16 is (a–b).

SUMMARY OF THE INVENTION

It is therefore a primary objective of the present invention to provide a method of forming a spacer of a gate on a semiconductor wafer to solve the above mentioned problem.

In a preferred embodiment, the present invention relates to a method of forming a spacer of a gate on a semiconductor wafer, the gate being protruded over a surface of the semiconductor wafer and having a top end and a side wall, the semiconductor wafer having at least one field oxide region on its surface which is located in proximity to the gate for electrically isolating the gate, the method comprising:

forming a first dielectric layer on the semiconductor wafer to cover the gate and the field oxide region wherein the first dielectric layer above the top end of the gate is thicker than the first dielectric layer above the field oxide region;

forming a second dielectric layer on the first dielectric layer to create a flat surface on the semiconductor wafer;

performing a first etching process to reduce the thickness of the second dielectric layer from the flat surface to a predetermined thickness which also reduces the thickness of the first dielectric layer above the top end of the gate;

performing a second etching process to remove the second dielectric layer completely; and performing an anisotropic etching process to remove the first dielectric layer above the top end of the gate and form a spacer on the side wall of the gate.

It is an advantage of the present invention that reduction in thickness of the field oxide region is improved so the efficiency of electrical isolation is not affected.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
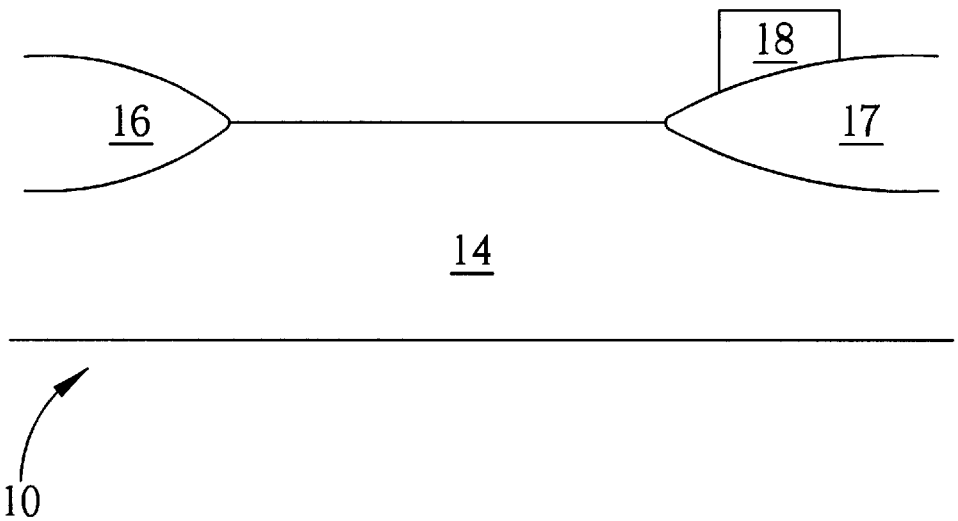
FIGS. 1 to 3 are schematic diagrams of a method of forming a spacer 12 of a gate 18 on a semiconductor wafer 10 according to the prior art.
Figure 2:
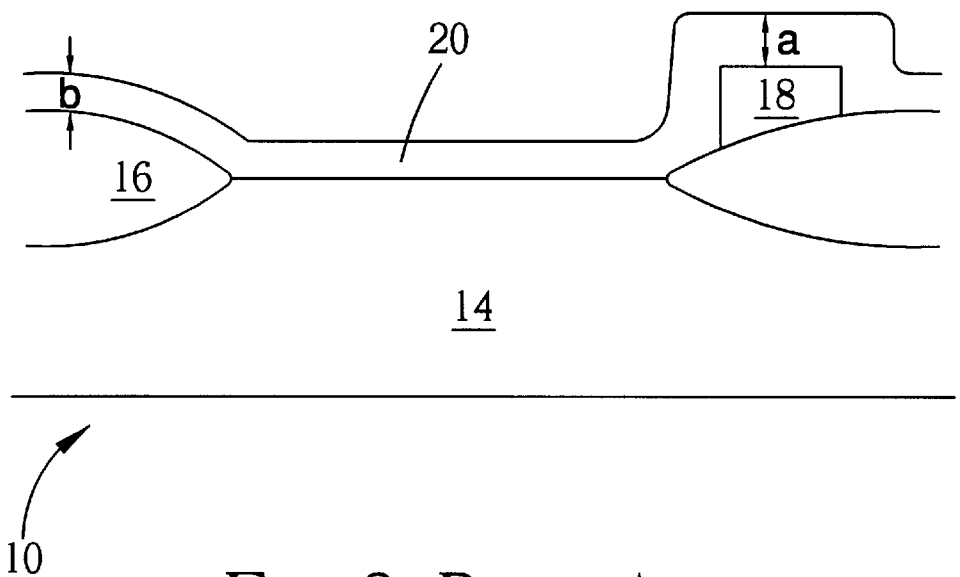
Figure 3:
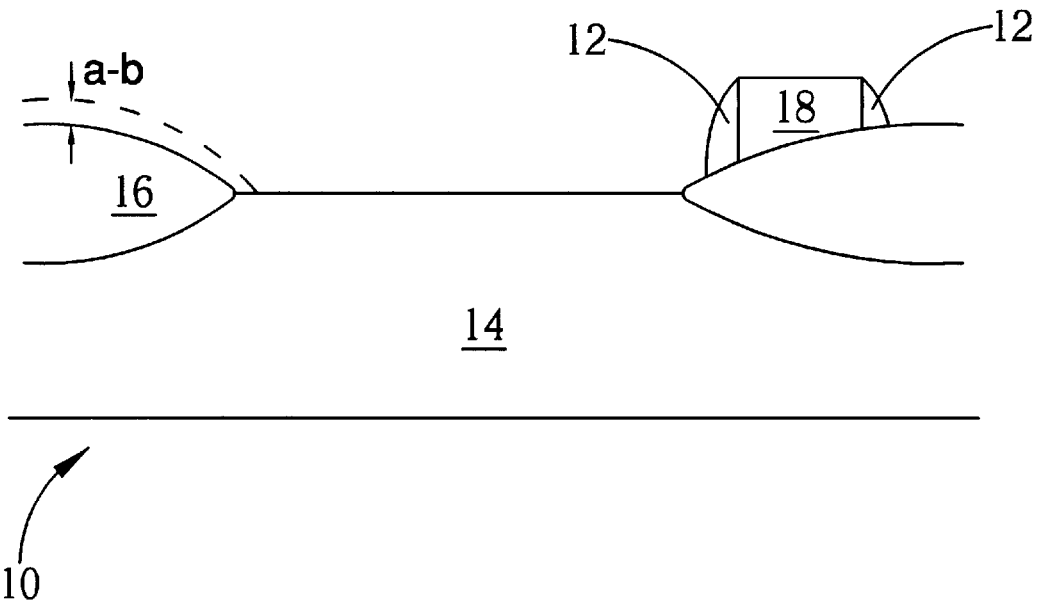
Figure 4:
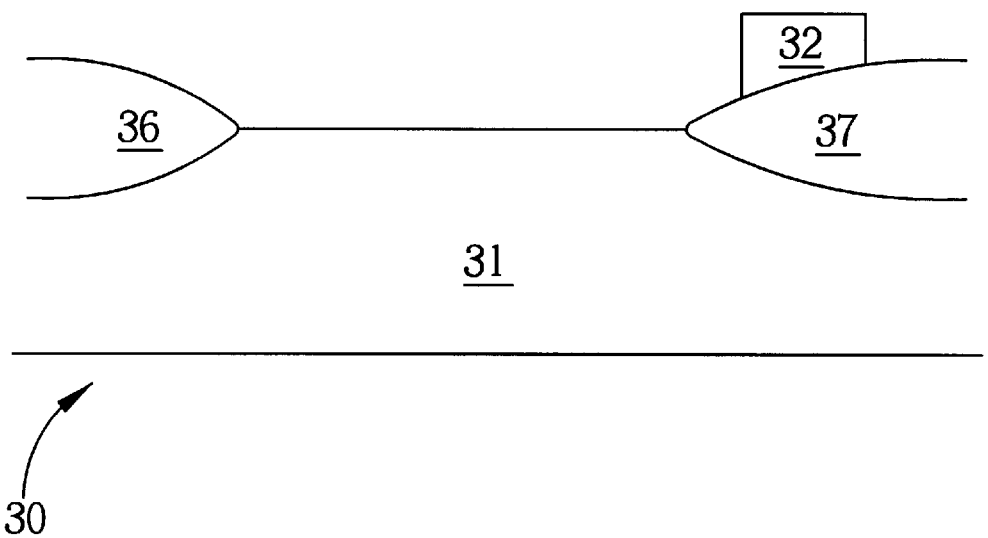
FIG. 4 to FIG. 9 are schematic diagrams of a method of forming a spacer of a gate on a semiconductor wafer according to the present invention.

FIG. 4 to FIG. 9 are schematic diagrams of a method of forming a spacer 34 of a gate 32 on a semiconductor wafer 30 according to the present invention. As shown in FIG. 4, a semiconductor wafer 30 comprises a Si substrate 31, two field oxide regions 36,37 on the surface of the Si substrate 31 for electrical isolation, and a gate 32 formed above the field oxide region 37. The top end of the gate 32 is higher than the top end of the field oxide region 36.

Figure 5:
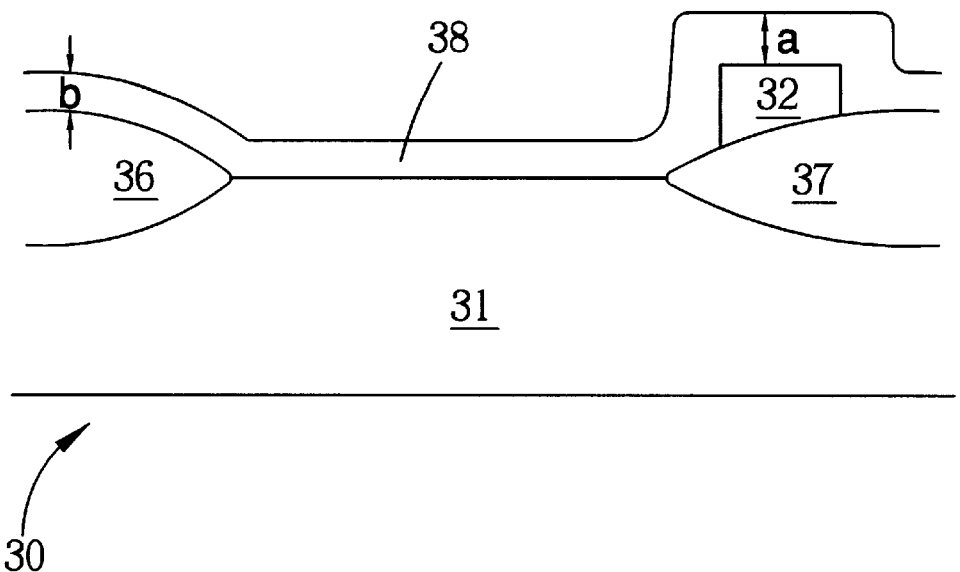
Figure 6:
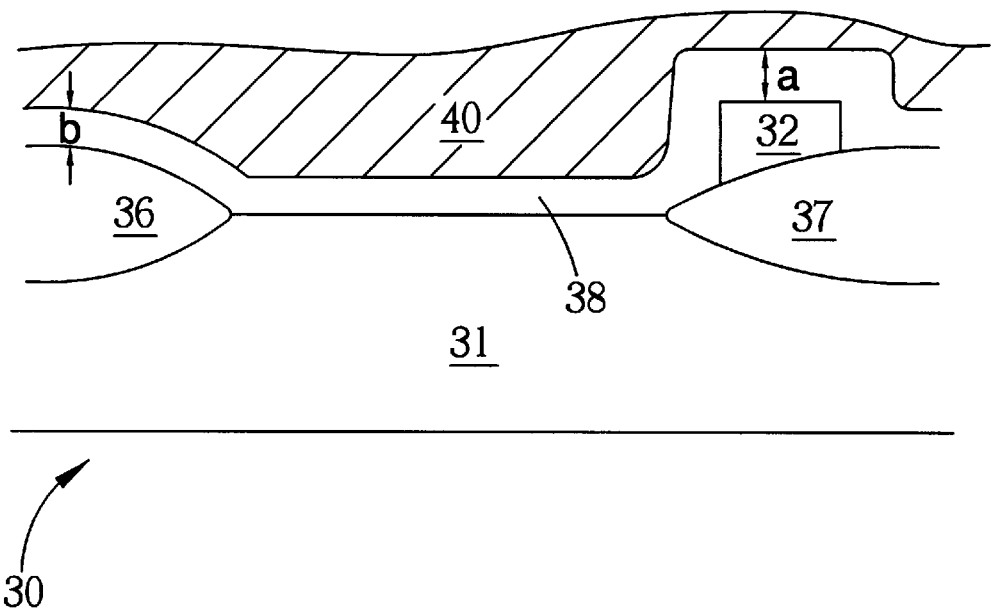

According to the present invention, the first step of forming the spacer 34 of the gate 32 on the semiconductor wafer 30 involves formation of a USG dielectric layer 38 on the surface of the semiconductor wafer 30 by performing APCVD. This process is illustrated in FIG. 5. Since the top end of the gate 32 is higher than the top end of the field oxide region 36, the thickness (a) of the USG dielectric layer 38 above the gate 32 (a) is larger than the thickness (b) of the USG dielectric layer 38 above the field oxide region 36. Next, a SOG (spin-on glass) dielectric layer 40 is coated onto the USG dielectric layer 38 thereby creating a flat surface on the semiconductor wafer 30. As shown in FIG. 6, the SOG dielectric layer 40 above the gate 32 is thinner than the SOG dielectric layer 40 above the field oxide region 36.

Figure 7:
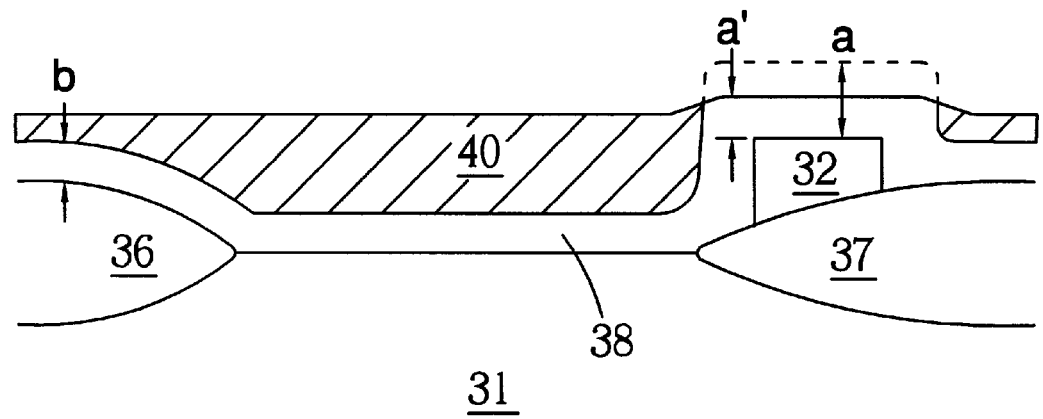
Figure 8:
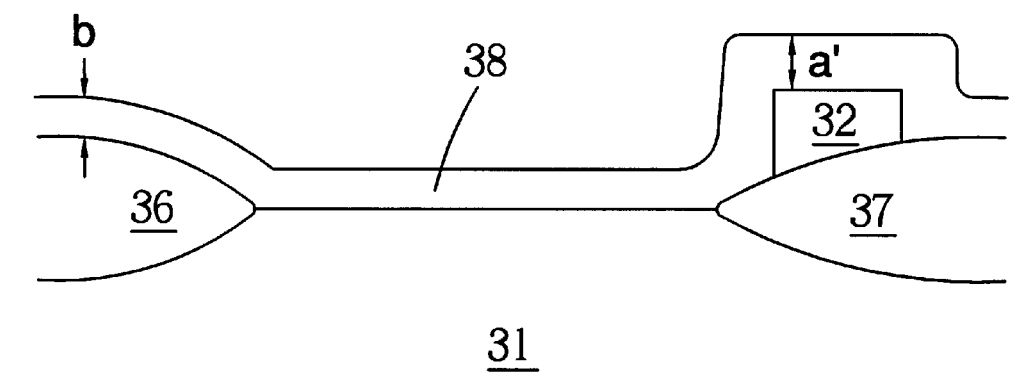

Afterward, as shown in FIG. 7, a plasma etch process is performed on the surface of the semiconductor wafer 30 to remove a predetermined thickness of the SOG dielectric layer 40 and USG dielectric layer 38. It results in the thickness (a') of the USG dielectric layer 38 above the gate 32 being equal to the thickness (b) of the USG dielectric layer 38 above the field oxide region 36. The dashed line in FIG. 7 indicates the top end of the USG dielectric layer 38 above the gate 32 before etching. As shown in FIG. 8, a wet etch process is performed to completely remove the SOG dielectric layer 40 above the surface of the semiconductor wafer 30. This wet etching process is performed by using an etching solution comprising potassium hydroxide (KOH) or hydrofluoric acid (HF) or a buffered oxide etcher (BOE) solution with a water to BOE ratio of 10:1.

Figure 9:
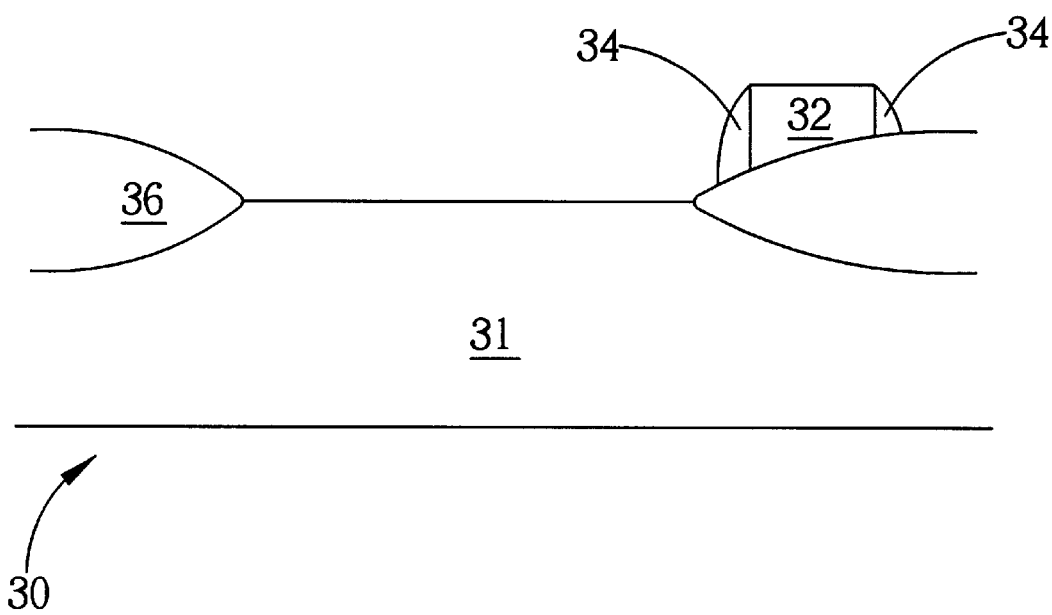

Lastly, as shown in FIG. 9, an anisotropic etching process is performed to remove a large portion of the USG dielectric layer 40 from the surface of the semiconductor wafer 30. Some of this layer is left on the side-wall of the gate 32 to form the spacer 34. The anisotropic etching process is a dry etching process performed with a mixed gas comprising carbon tetrachloride ($CF_4$), carbon trifluoride ($CHF_3$), argon (Ar), oxygen ($O_2$) and hydrogen ($H_2$).

According to the present invention, the method of forming the spacer 34 of the gate 32 on the semiconductor wafer 30 can be summarized as below. An APCVD process is first performed to form an USG dielectric layer 38 on the surface of the semiconductor wafer 30. Secondly, a spin coating process is performed to form a SOG dielectric layer 40 on the USG dielectric layer 38. This creates a planar surface on the semiconductor wafer 30. And then, a plasma etching process is performed to remove a portion of the SOG dielectric layer 40 to a predetermined depth and to reduce the thickness of the USG dielectric layer 38 on the top end of the gate 32. A wet etching process is performed to completely remove the SOG dielectric layer 40 from the surface of the semiconductor wafer 30. The thickness (a') of the USG dielectric layer 38 on the top end of the gate 32 is approximately equal to the thickness (b) of the USG dielectric layer 38 on the top end of the field oxide 36. Finally, a dry etching process is performed to completely remove the USG dielectric layer 38 from the top end of the gate 32 and form a spacer 34 on the side-wall of the gate 32. So the thickness of the etched field oxide 36 is approximately equal to the thickness of the original field oxide 36.

Figure 10:
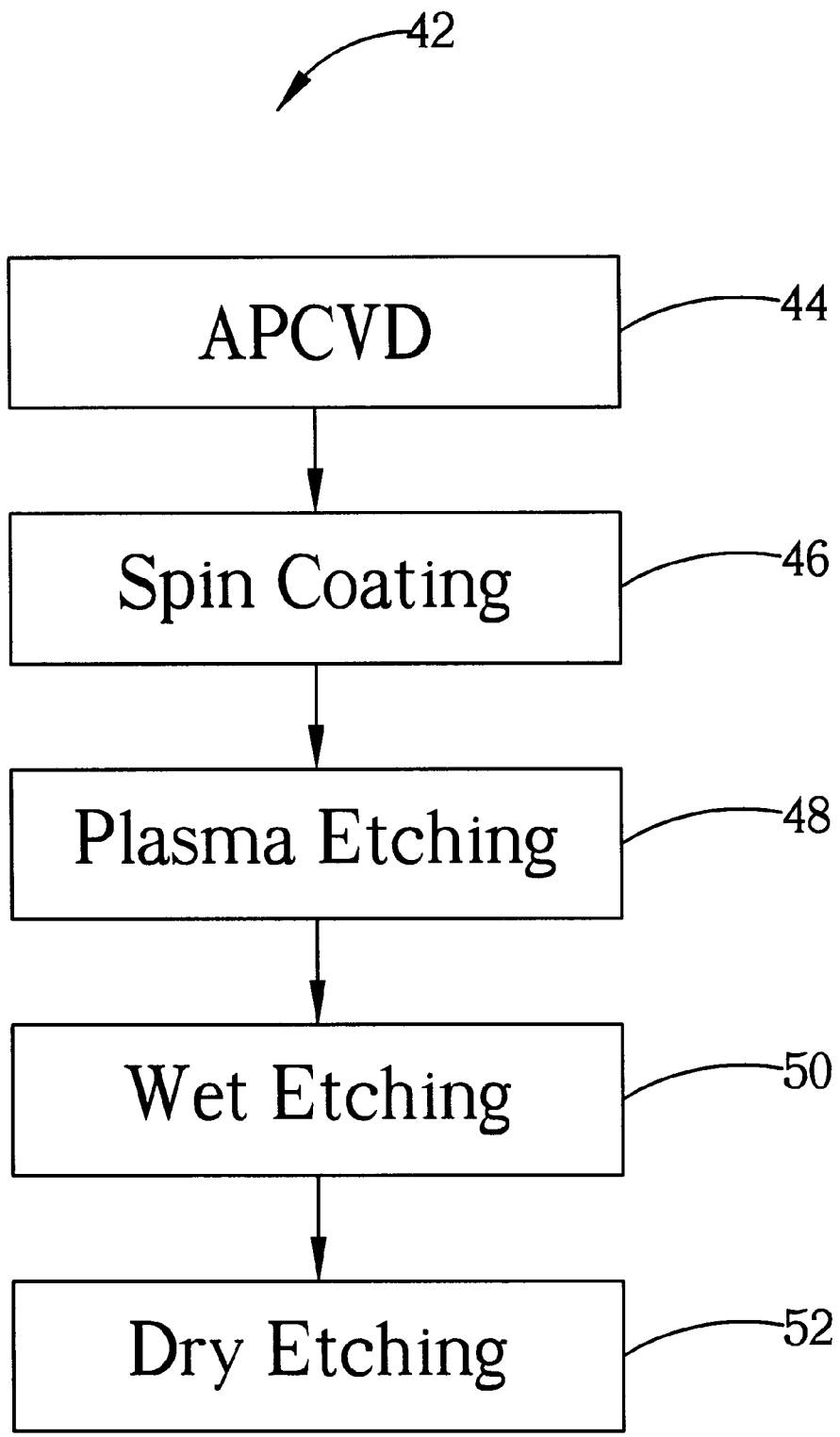
FIG. 10 is a flow chart of forming the spacer of the gate on the semiconductor wafer according to the present invention.

Please refer to FIG. 10, FIG. 10 is a flow chart of forming the spacer 34 of the gate 32 on the semiconductor wafer 30 according to the present invention. The following is a summary of the process 42 of forming the spacer 34 of the gate 32:

Step 44: performing an APCVD process to form an USG dielectric layer 38 on the surface of the semiconductor wafer 30.

Step 46: performing a spin coating process to form a SOG dielectric layer 40 on the USG dielectric layer 38 for the planarization of the semiconductor wafer 30.

Step 48: performing a plasma etching process to remove a portion of the SOG dielectric layer to a predetermined depth and to reduce the thickness of the USG dielectric layer 38 on the top end of the gate 32.

Step 50: performing a wet etching process to completely remove the SOG dielectric layer 40 from the surface of the semiconductor wafer 30.

Step 52: performing a dry etching to completely remove the USG dielectric layer 38 from the top end of the gate 32 and form a spacer 34 on the side-wall of the gate 32.

In contrast to the prior art method, the method of forming the spacer 34 of the gate 32 on the semiconductor wafer 30 performs a spin coating process to form an SOG dielectric layer 40 on the USG dielectric layer 38. This creates a planar surface on the semiconductor wafer 30. Plasma etching, wet etching and dry etching are then performed. The plasma etching process removes a portion of the USG dielectric layer 38 from the top end of the gate 32. When the USG dielectric layer 38 is completely removed from the top end of the gate 32 in subsequent etching processing, thinning of the field oxide region 36 is reduced and electrical isolating efficiency of the field oxide region 36 is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a spacer of a gate on a semiconductor wafer, the gate being protruded over a surface of the semiconductor wafer and having a top end and a side wall, the semiconductor wafer having at least one field oxide region on its surface which is located in proximity to the gate for electrically isolating the gate, the method comprising:

forming a first dielectric layer on the semiconductor wafer to cover the gate and the field oxide region wherein the first dielectric layer above the top end of the gate is thicker than the first dielectric layer above the field oxide region;

forming a second dielectric layer on the first dielectric layer to create a flat surface on the semiconductor wafer;

performing a first etching process to reduce the thickness of the second dielectric layer from the flat surface to a predetermined thickness which also reduces the thickness of the first dielectric layer above the top end of the gate;

performing a second etching process to remove the second dielectric layer completely; and performing an anisotropic etching process to remove the first dielectric layer above the top end of the gate and form a spacer on the side wall of the gate.

2. The method of claim 1 wherein during the first etching process, the thickness of the first dielectric layer above the top end of the gate is reduced to at least that of the first dielectric layer above the field oxide region.

3. The method of claim 1 wherein the first dielectric layer is formed of undoped silicate glass (USG).

4. The method of the claim 1 wherein the second dielectric layer is formed by spin-coating a liquid dielectric material on the semiconductor wafer.

5. The method of the claim 4 wherein the liquid dielectric material is liquid spin-on glass.

6. The method of claim 1 wherein the first etching process is a plasma etching process.

7. The method of claim 1 wherein the second etching process is a wet etching process.

8. The method of claim 7 wherein the wet etching process is performed by using an etching solution comprising potassium hydroxide (KOH) or hydrofluoric acid (HF).

9. The method of claim 7 wherein the wet etching process is performed by using a buffered oxide etcher (BOE) solution with a water to BOE ratio of 10:1.

10. The method of claim 1 wherein the anisotropic etching process is a dry etching process performed by using a mixed gas comprising carbon tetrachloride ($CF_4$), carbon trifluoride ($CHF_3$), argon (Ar), oxygen ($O_2$) and hydrogen ($H_2$).

* * * * *